United States Patent

Wong et al.

[11] Patent Number: 5,983,174
[45] Date of Patent: Nov. 9, 1999

[54] CONFIDENCE AND FRAME SIGNAL QUALITY DETERMINATION IN A SOFT DECISION CONVOLUTIONAL DECODER

[75] Inventors: Wing Tak Kenneth Wong, Kwai Chung NT. T, The Hong Kong Special Administrative Region of the People's Republic of China; Danny Yuk-Kun Wong, Chepstow, United Kingdom

[73] Assignee: British Telecommunications public limited company, London, United Kingdom

[21] Appl. No.: 09/043,164
[22] PCT Filed: Oct. 3, 1996
[86] PCT No.: PCT/GB96/02423
   § 371 Date: Mar. 12, 1998
   § 102(e) Date: Mar. 12, 1998
[87] PCT Pub. No.: WO97/14235
   PCT Pub. Date: Apr. 17, 1997

[30] Foreign Application Priority Data

Oct. 6, 1995 [GB] United Kingdom ............ 9520445

[51] Int. Cl.[6] ............ H04L 1/20; H03M 13/00
[52] U.S. Cl. ............ 704/228; 704/226
[58] Field of Search ............ 704/226, 227, 704/228

[56] References Cited

U.S. PATENT DOCUMENTS 5,144,644  9/1992  Borth ............ 375/341

FOREIGN PATENT DOCUMENTS

| 490 552 | 6/1992 | European Pat. Off. ........ H04L 27/34 |
| 38 05 169 | 8/1989 | Germany ............ H03M 13/12 |
| 42 29 654 | 4/1993 | Germany ............ H03M 7/00 |

OTHER PUBLICATIONS

IEEE International Conference on Communications Supercomm/ICC 1994, New Orleans, US, vol. 3, May 1, 1994, IEEE, New York, US pp. 1236–1241 "Hoeher, Unequal Error Protection for Digital Mobile DS–CDMA Radio Systems".

ITG Fachbericht 118.9 Fachtagung Horrundfunk (Audio Broadcasting), Mannheim, vol. 118, Feb. 18, 1992, Vde Verlag, Berlin/Offenbach, 1992, DE, pp. 109–112, Weck, "Optimierung der Empfangsqualitat durch angepassten Fehlerschutz bei DAB".

IEEE Transactions on Vehicular Technology, vol. 43, No. 4, Nov. 1994, New York, US, pp. 1078–1087, Shi et al, "Combined Speech and Channel Coding for Mobile Radio Communicatons".

L. H. C. Lee and P. G. Farrelll, "Concatenated Coding and Interleaving for Half–Rate GSM Digital Mobile Radio System," Electronics Letters, vol. 27, No. 14, pp. 1274–1276, Jul. 4, 1991.

Hong Shi, Paul K. M. Ho, and Vladimir Cuperman, "Combined Speech and Channel Coding for Mobile Radio Communications,"IEEE Trans. on Vehicular Technology, vol. 43, No. 4, pp. 1078–1087, Nov. 1994.

Primary Examiner—David R. Hudspeth
Assistant Examiner—Tālivaldis Ivars Šmits
Attorney, Agent, or Firm—Nixon & Vanderhye P.C.

[57] ABSTRACT

Received signals are processed to generate bit confidence measure signal values. Before these are forwarded to a soft decision decoder, correction factors are applied, e.g., by a look-up table, to reduce the extent to which the signal statistics differ from a logarithmic representation of the error statistics of the received signals. Alternatively, or as well, the bit confidence measure signal values may be summed and thresholded to provide a quality-indicating signal.

11 Claims, 10 Drawing Sheets

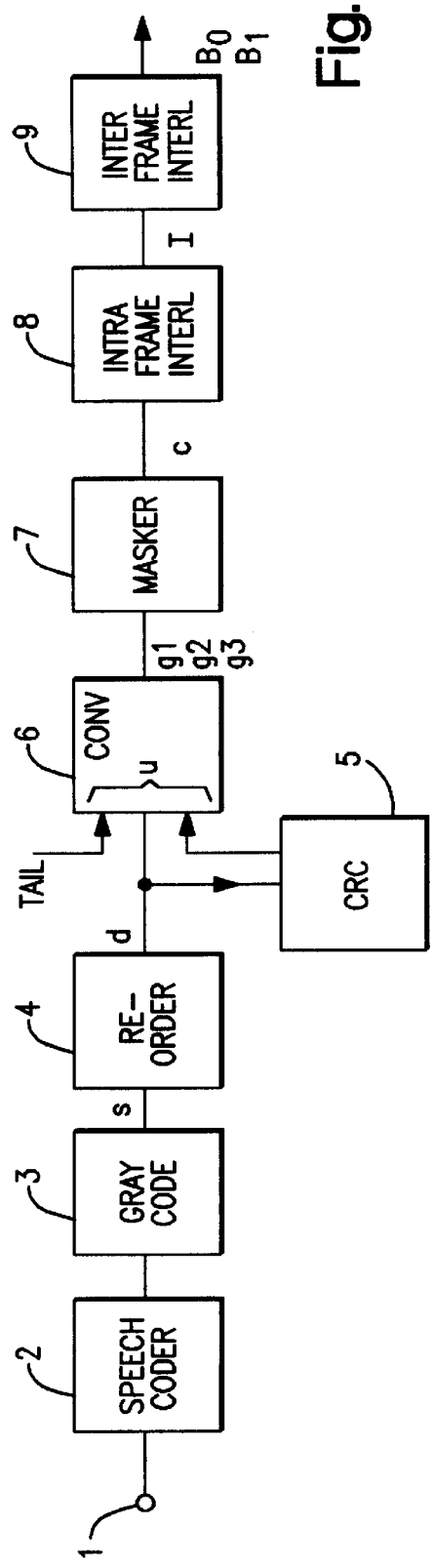
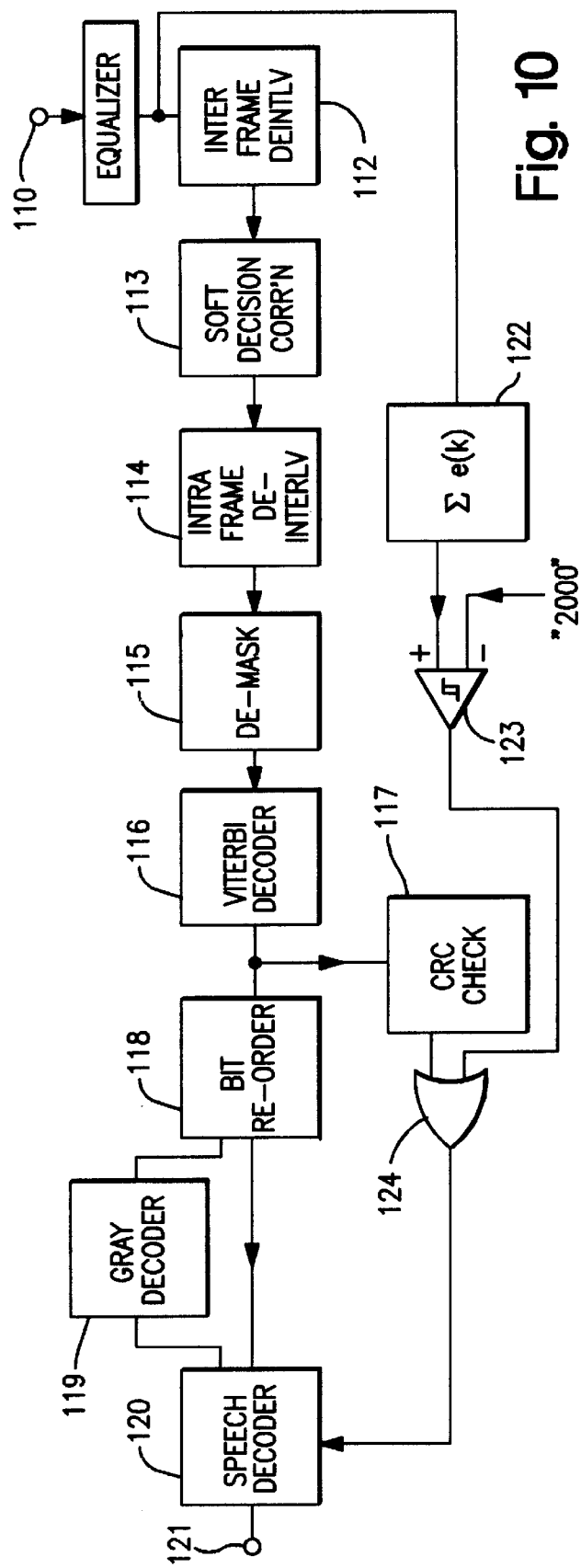

CONFIDENCE AND FRAME SIGNAL QUALITY DETERMINATION IN A SOFT DECISION CONVOLUTIONAL DECODER

This application claims the benefit under 35 U.S.C. Section 365 (c) of International Application Number PCT/GB96/02423 filed on Oct. 3, 1996.

FIELD OF THE INVENTION

The present application is concerned with transmission of data using convolutional codes and is particularly, though not exclusively, concerned with the transmission of digitally coded speech signals.

SUMMARY OF THE INVENTION

According to one aspect of the present invention there is provided a method of decoding signals by processing received signals to provide confidence measure signals and using a soft decision decoder to decode the received signal values, the method comprising:

(a) receiving known signals;

(b) storing data representing the extent to which the confidence measure signal value statistics for the received known signals differ from a logarithmic representation of the error statistics of the received known signals;

(c) receiving unknown signals;

(d) applying correction factors to the confidence measure signal values for the received unknown signals, the correction factors being derived from the said stored data, so as to reduce the extent to which the confidence measure signal value statistics differ from the said logarithmic representation;

(e) decoding the corrected signals using the soft decision decoder.

In another aspect the invention provides an apparatus for decoding signals comprising:

means for processing received digital signals to provide confidence measure signal values;

translation means operable to apply correction factors to the confidence measure signal values so as to reduce the extent to which the confidence measure signal value statistics differ from a logarithmic representation of the error statistics of the received signals; and a soft decision decoder to decode the corrected signals.

In a preferred embodiment the correction factors are derived from tests performed by:

(a) receiving known signals;

(b) storing data representing the extent to which the confidence measure signals for the received known signal value statistics differ from a logarithmic representation of the error statistics of the received known signals.

The apparatus may also include means to form a sum of the confidence measure signal values for a frame period of the signal and means to compare the sum with a threshold value to provide a signal indicating the quality of the frame.

In another aspect the invention provides means for processing received digital signals to provide confidence measure signal values;

means to form a sum of the confidence measure signal values for a frame period of the signal;

means to compare the sum with a threshold value to provide a signal indicating the quality of the frame.

Preferably the apparatus may include means operable in response to the said signal indicating the quality of the frame to suppress further processing of those which are of a lower quality than that determined by the said threshold.

A further aspect of the invention provides a method of transmitting data bits comprising, for each of successive frame periods, formatting the bits into a frame sequence, coding the bits by means of a convolutional coder, including generating error check bits which are a function of (a) bits formatted into the beginning of the frame sequence and (b) bits formatted into the end of the frame sequence.

Preferably the bits (a) may be taken from the first 50% of the frame and the bits (b) may be taken from the last 25% of the frame.

BRIEF DESCRIPTION OF THE DRAWINGS

Some embodiments of the invention will now be described, by way of example, with reference to the accompanying drawings, in which:

FIG. 1 is a block diagram of an apparatus for the transmission of speech signals;

FIG. 10 is a block diagram of an apparatus for receiving speech signals and

DETAILED DESCRIPTION OF EXEMPLARY EMBODIMENTS

Figure 2:
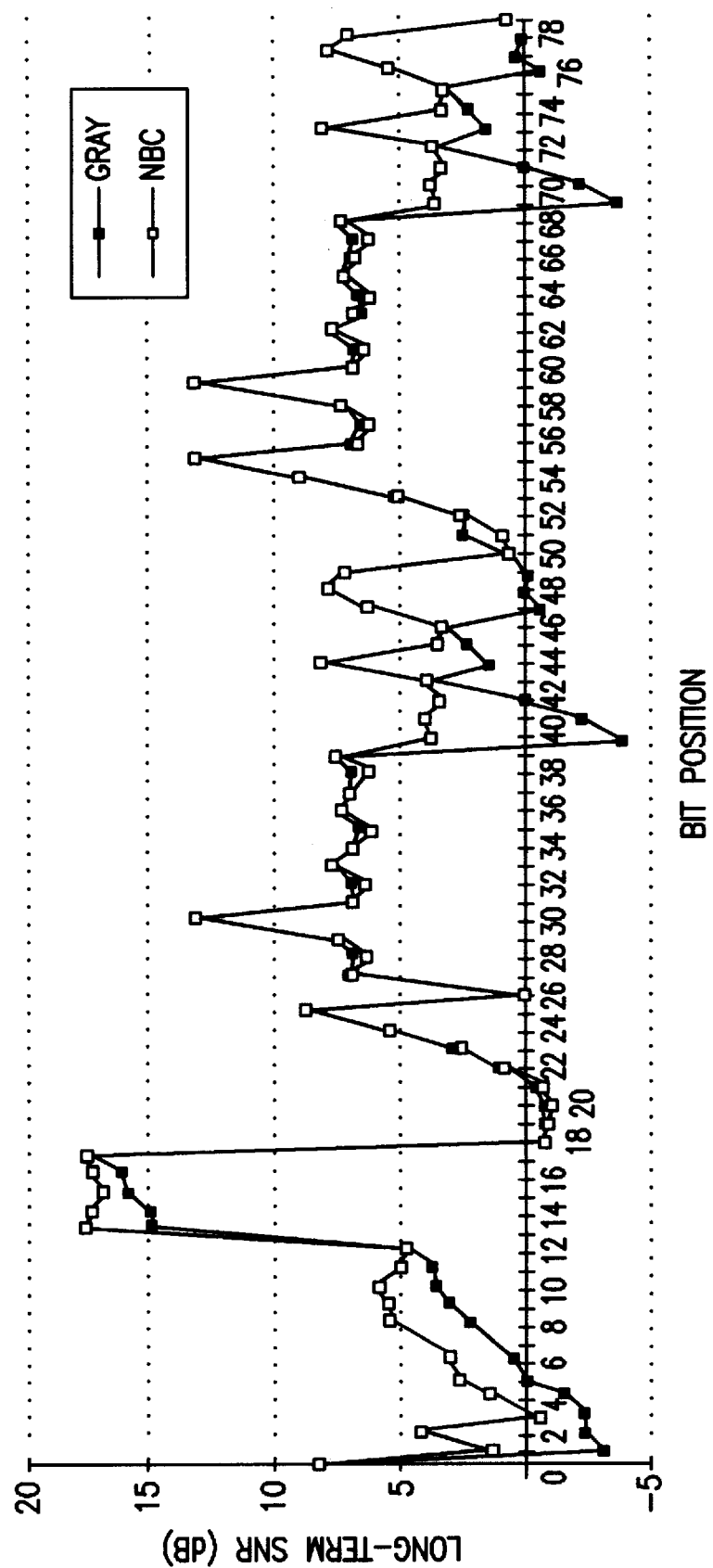
FIGS. 2 and 3 show graphically the results of error tests on the speech coder used in the apparatus of FIG. 1.

In FIG. 1, speech signals are received in digital form at an input 1 and are supplied to a digital speech coder 2. The preferred coder is a codebook excited linear predictive (CELP) coder, operating at 8 kbit/s, in accordance with standard G.729 of the International Telecommunications Union. However, other types of coder may be used, and, indeed, simple p.c.m. is not excluded.

The coder 2 analyses each 10 ms frame of speech samples and, for each, produces 79 bits representing a number of parameters (enumerated below) which serve, at a receiver to drive a decoder which synthesises received speech signals. Certain of these parameters are re-coded using Gray code, in a unit 3.

These bits are to be formatted into a bit-serial frame for coding by means of convolutional codes. First, the bits are assembled into a specific order in a unit 4, then three cyclic redundancy check bits are generated in a unit 5 from the first 26 and last 6 bits of the frame, and appended to the beginning of the frame, which now has 82 bits. These are followed by six tailing bits of fixed value such as zero a known expedient in convolutional encoding for clearing the coder memory and permitting the corresponding decoder to reset itself at the end of a frame to reduce error propagation.

The signals are then supplied to a convolutional coder which operates according to a basic code and two punctured codes derived from it, switching between these during the course of a frame. The basic code, in this example, has a rate of 1/3 —i.e. it produces 3n output bits for every n bits input to it. A punctured code operates at a higher rate than the basic code, by simply deleting some of the bits output by the basic coder; this increases the rate of the code but reduces its error-correcting ability. It has the advantage over using entirely unrelated codes of relative simplicity and not requiring the insertion of tailing bit between code changes. This process is shown in FIG. 1 as a convolutional coder 6 operating according to the basic code, and hence producing 3×82=246 bits per frame, followed by a masking unit 7 which deletes bits according to a desired puncturing pattern.

The coded bits are then subjected to intra-frame and inter-frame interleaving (8,9) which serves to improve the robustness of the system against the burst errors common in radio transmission. Interleaving of this kind is well known.

The design is based on the following observations:

(a) some of the bits generated by the speech coder 2 are more sensitive to transmission errors than others. That is, the observed signal-to noise ratio at the output of a speech decoder at a receiver in the presence of a given error rate in a particular one of the 79 bits is, for some bits, relatively good and for others relatively poor.

(b) the level of received transmission errors over a given channel is higher for some of the bits in the frame than for others. More particularly, the error rate tends to be lower at the beginning and end of the frame (after interleaving has been removed) than in the middle, as in those regions the decoder for the convolutional code is commencing from (or converging on) a known state.

(c) the overall signal-to-noise ratio of the system can be improved by allocating sensitive bits to low-error positions in the frame and allocating less-sensitive bits to high-error positions in the frame.

d) this effect may be further enhanced by switching between different code rates during the course of a frame so that the distribution of error rates over the frame can be shaped to improve the match between this and the distribution of sensitivity among the various bits produce by the speech coder. Whilst no systematic method of optimising this shaping has yet been found, in general terms one aims to keep the maximum bit error rate low, whilst the number of bit positions within the frame which have a very low error rate is sufficient to accommodate all of the most sensitive bits.

The following table sets out the bits generated by the G.729 speech coder 2.

TABLE I

| index | label s(k) | no. of bits | description |
|---|---|---|---|
| 00 | LSP1MA | 1 | Predictor switch |
| 01 to 07 | LSP1 | 7 | Codeword for vector-quantised predictor coefficient set |
| 08 to 12 | LSP2 | 5 | Codeword for vector-quantised difference between the actual first five coefficients and those given by LSP1 |
| 13 to 17 | LSP3 | 5 | Codeword for vector-quantised difference between the actual second five coefficients and those given by LSP1 |
| 18 to 25 | M1 | 8 | Pitch period for long-term predictor - first 5 ms sub-block |
| 26 | | 1 | Parity check bit (not used) |
| 27 to 39 | CB1 | 13 | Codebook code for excitation positions for first 5 ms sub-block |
| 40 to 43 | S1 | 4 | Codebook pulse signs |
| 44 to 50 | G1 | 7 | Gains |
| 51 to 55 | M2 | 5 | Pitch period for long-term predictor - second 5 ms sub-block (expressed as differential from M1) |
| 56 to 68 | CB2 | 13 | Codebook code for excitation positions for second 5 ms sub-block |
| 69 to 72 | S2 | 4 | Codebook pulse signs |
| 73 to 79 | G2 | 7 | Gains |

The sensitivity of these bits was measured by, for each bit, (a) inverting the bit (i.e. simulating a 100% error rate)

(b) measuring the signal-to-noise ratio and spectral distortion at the output of a G.729 decoder.

Figure 3:
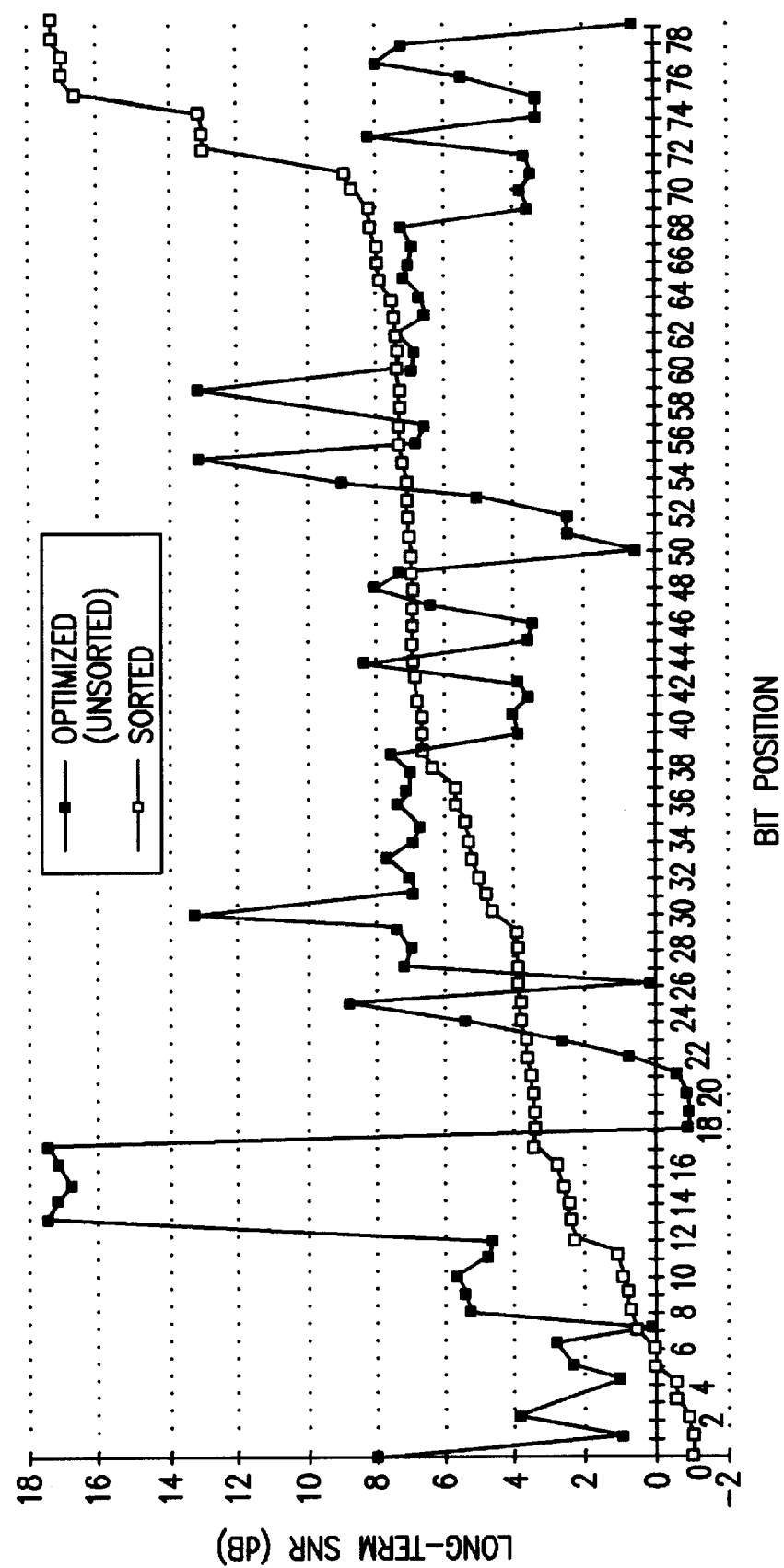

The results are shown in FIG. 2, where the horizontal axis shows the bit index number as shown in the table and the vertical axis shows the signal-to-noise ratio (SNR). A considerable variation in sensitivity is seen. The same results, plotted in ascending order of SNR is shown in FIG. 3 for later reference.

Similar tests performed using Gray code to represent each variable show a small improvement in SNR on the pitch parameters M1 and M2 and codewords CB1 and CB2, but poorer performance on others, and for this reason Gray code is applied by the unit 3 only to those four parameters. Naturally, for CB1 and CB2, this improvement is contingent on adjacent Gray codes being assigned to codebook entries representing mutually similar excitations.

Turning now to the convolutional coding, the basic code used in this example is a 1/3 rate code, defined by the generator polynomials:

$$g1=1+X^2+X^3+X^5+X^6$$

$$g2=1+X+X^2+X^3+X^6$$

$$g3=1+X+X^2+X^3+X^4+X^5+X^6$$

In addition, two punctured versions of this code are employed, namely a second code having a rate of 2/5 in which alternate bits g3 are omitted and a third code, of rate 1/2, in which all bits g3 are omitted. Punctured codes are well known per se—see for example, J. Hugenaur, N. Seshadri and C. E. W. Sundberg, "The Performance of Rate-Compatible Punctured Codes for Future Digital Mobile Radio" IEEE Vehicular Technology Conference, June 1988.

The codes are assigned to bit positions within the frame, as follows:

TABLE II

| No. bits | Rate | Bits generated | Use |
|---|---|---|---|
| 3 | 1/3 | 9 | CRC bits |
| 26 | 1/3 | 78 | speech coder bits |
| 34 | 2/5 | 85 | speech coder bits |
| 7 | 1/2 | 14 | speech coder bits |
| 12 | 2/5 | 30 | speech coder bits |
| 6 | 1/2 | 12 | tailing bits |
| 88 | | 228 | |

Figure 4:
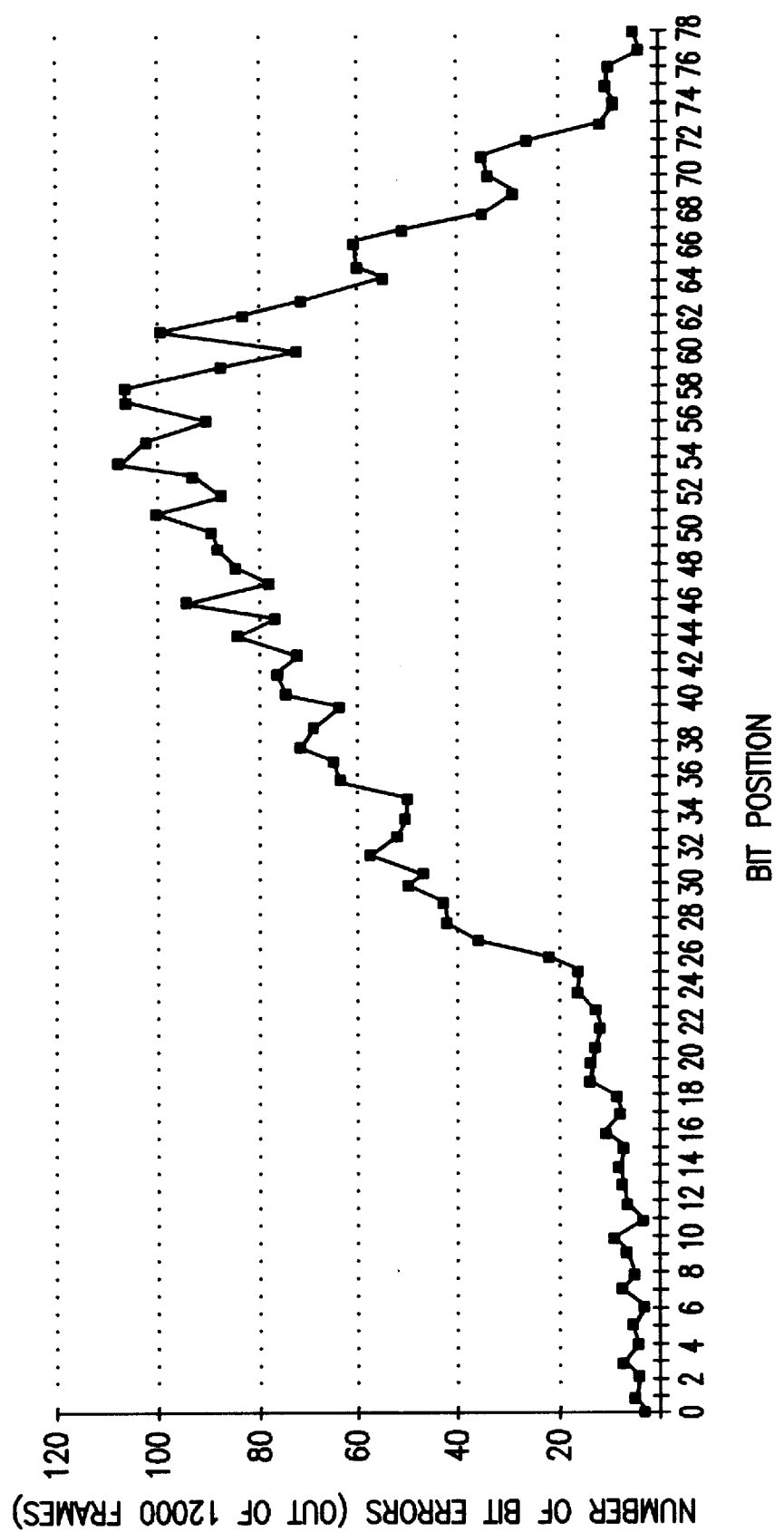
FIGS. 4 and 5 show graphically the results of error tests on the convolutional codes used in the apparatus of FIG. 1.

This convolutional coder was tested for 12000 frames under simulated transmission error conditions using an error test file EP3 as described in "Error patterns for the qualification zest of TCH-HS" ETST:TM3/TCH-HS. TD No. 89/1 for the ETSI GSM mobile radio standard and the residual bit error rate (RBER)—i.e. the error rate after decoding by a Viterbi decoder—measured. In these tests, a cyclic redundancy check was performed and frames failing this test were rejected. The RBER results for the non-rejected frames are plotted for each speech bit position in FIG. 4 (and in FIG. 5 in ascending order of RBER).

Figure 5:
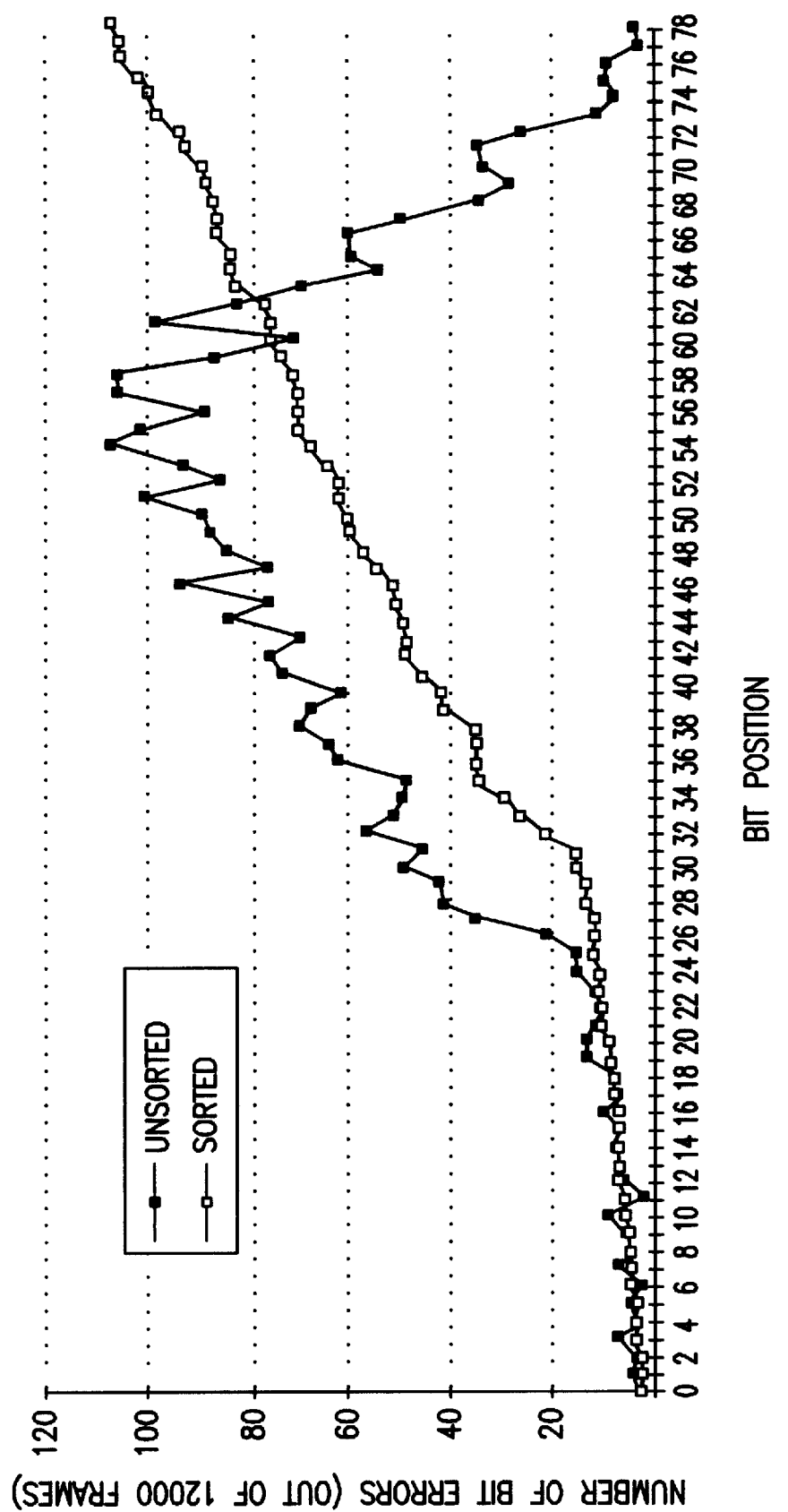

A comparison of FIG. 5 with the sensitivity distribution of FIG. 3 does not of course show an identity of shape: indeed such identity is probably not achievable; moreover, a number of other considerations are applied, as will be discussed below.

The allocation of coder and CRC bits to frame positions performed in the assembly unit 4 is as shown in Table III.

Underlying this allocation is the notion that one allocates sensitive bits from the speech coder to low-error rate positions within the frame supplied to the convolutional coder. If this were the only consideration, one would simply take the speech coder bits in ascending order of SNR and allocate then to frame positions in ascending order of RBER. This of course would produce a workable system, but the allocation given above has some advantages. First, it is a characteristic of the Viterbi decoders generally used for the decoding of convolutional codes that when the channel error conditions reach a level such that errors occur in the decoded output, then there is a tendency for such errors to be grouped—e.g. with a pair of consecutive decoded bits being incorrect. It is therefore preferred not to allocate consecutive frame positions to the same one of the speech coder parameters; i.e. a degree of bit-interleaving is also applied prior to the convolutional coding. This is not performed as a separate operation but is inherent in the allocation table.

TABLE III

| Conv. Coder Frame | Speech Coder Frame |
| --- | --- |
| 0 | 1 |
| 1 | 18 |
| 2 | 2 |
| 3 | 50 |
| 4 | 19 |
| 5 | 3 |
| 6 | 46 |
| 7 | 20 |
| 8 | 4 |
| 9 | 45 |
| 10 | 21 |
| 11 | 5 |
| 12 | 44 |
| 13 | 22 |
| 14 | 6 |
| 15 | 23 |
| 16 | 8 |
| 17 | 7 |
| 18 | 47 |
| 19 | 9 |
| 20 | 51 |
| 21 | 10 |
| 22 | 52 |
| 23 | 11 |
| 24 | 49 |
| 25 | 12 |
| 26 | 48 |
| 27 | 53 |
| 28 | 40 |
| 29 | 24 |
| 30 | 41 |
| 31 | 0 |
| 32 | 42 |
| 33 | 54 |
| 34 | 43 |

TABLE III-continued

| Conv. Coder Frame | Speech Coder Frame |
| --- | --- |
| 35 | 55 |
| 36 | 35 |
| 37 | 64 |
| 38 | 36 |
| 39 | 65 |
| 40 | 37 |
| 41 | 66 |
| 42 | 38 |
| 43 | 67 |
| 44 | 39 |
| 45 | 68 |
| 46 | 13 |
| 47 | 27 |
| 48 | 56 |
| 49 | 14 |
| 50 | 28 |
| 51 | 57 |
| 52 | 15 |
| 53 | 29 |
| 54 | 58 |
| 55 | 16 |
| 56 | 30 |
| 57 | 59 |
| 58 | 17 |
| 59 | 31 |
| 60 | 60 |
| 61 | 32 |
| 62 | 61 |
| 63 | 33 |
| 64 | 62 |
| 65 | 34 |
| 66 | 63 |
| 67 | 25 |
| 68 | 69 |
| 69 | 70 |
| 70 | 71 |
| 71 | 72 |
| 72 | 77 |
| 73 | 78 |
| 74 | 73 |
| 75 | 76 |
| 76 | 74 |
| 77 | 75 |
| 78 | 79 |
|    | 26 |

The second consideration is that whilst signal-to-noise ratio is a useful indication, nevertheless it is found that some speech coder parameters are subjectively more sensitive than others in that the effect of errors on one parameter may be more objectionable to the listener than errors in another parameter, even though the SNR is the same in both instances. Thus the above allocation table also reflects the fact that, based on listening tests, certain of the speech coder bits have been allocated frame positions that are more (or less) error-free than the SNR figures would suggest. If one examines the effect of the above allocations, for example by plotting the measured SNR of each speech coder bit graphically against the measured RBER of the corresponding allocated frame position, one sees that, whist the very sensitive bits (with SNRs below 4 dB) all occupy frame positions with RBER values less than 20, and those with SNRs greater than 16 occupy frame positions with RBERs grater than 80, the plot shows a considerable scatter about the monotonically increasing line that one would expect to see based on only the "simple" allocation method.

Figure 6:
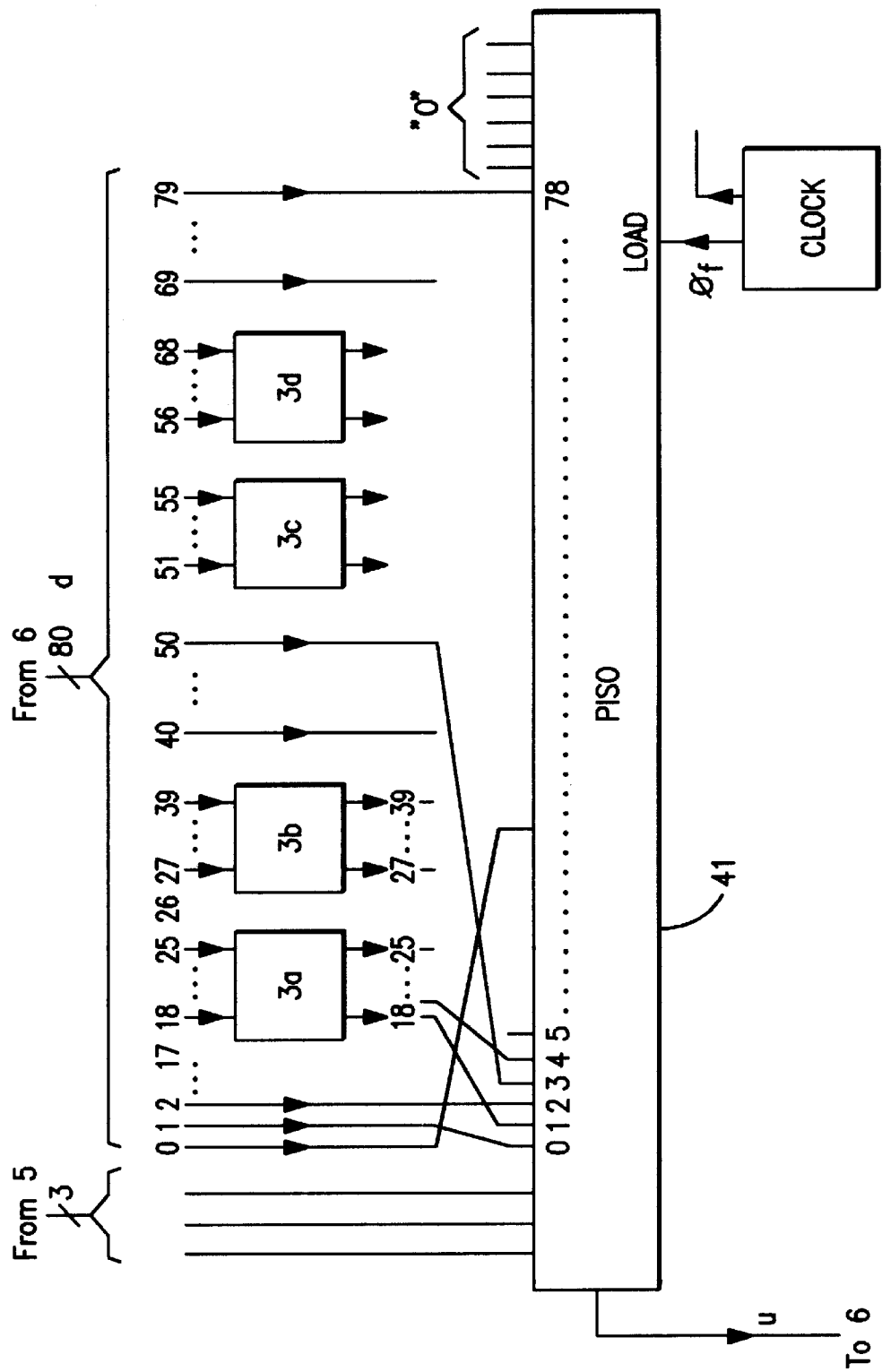
FIGS. 6, 7, 8 and 9 are block diagrams of, respectively, the reordering unit 4, convolutional coder 6 masking unit 8 and CRC unit 5 of the apparatus of FIG. 1 and FIG. 10.

The reordering unit 4 is shown in more detail in FIG. 6. It consists of an 88-bit serial-in, parallel-out shift register 41; the 79 speech coder output bits, the three outputs of the CRC unit 5 and six zeroes (tailing bits) are connected in accordance with the bit allocation table above to the parallel inputs. It is loaded in parallel by a frame pulse ff from a clock generator 10 and the bits clocked out by a 88×frame rate pulses $f_1$ from the clock generator. For convenience of illustration the Gray coder 3 is shown as separate units 3a to 3d. In the interests of clarity, only a few of the connections set out in Table III are shown. In the description which follows, the output of the PISO register 41 is referred to as u(k) where:

u(0), u(1) and u(3) are the CRC bits;

u(3) to u(81) are the speech coder bits numbered 0 to 78 in the "Conv, coder bits" column of Table II and in box 41 in FIG. 6, and in the same order; u(82) to u(87) are zero (tailing bits).

Figure 7:
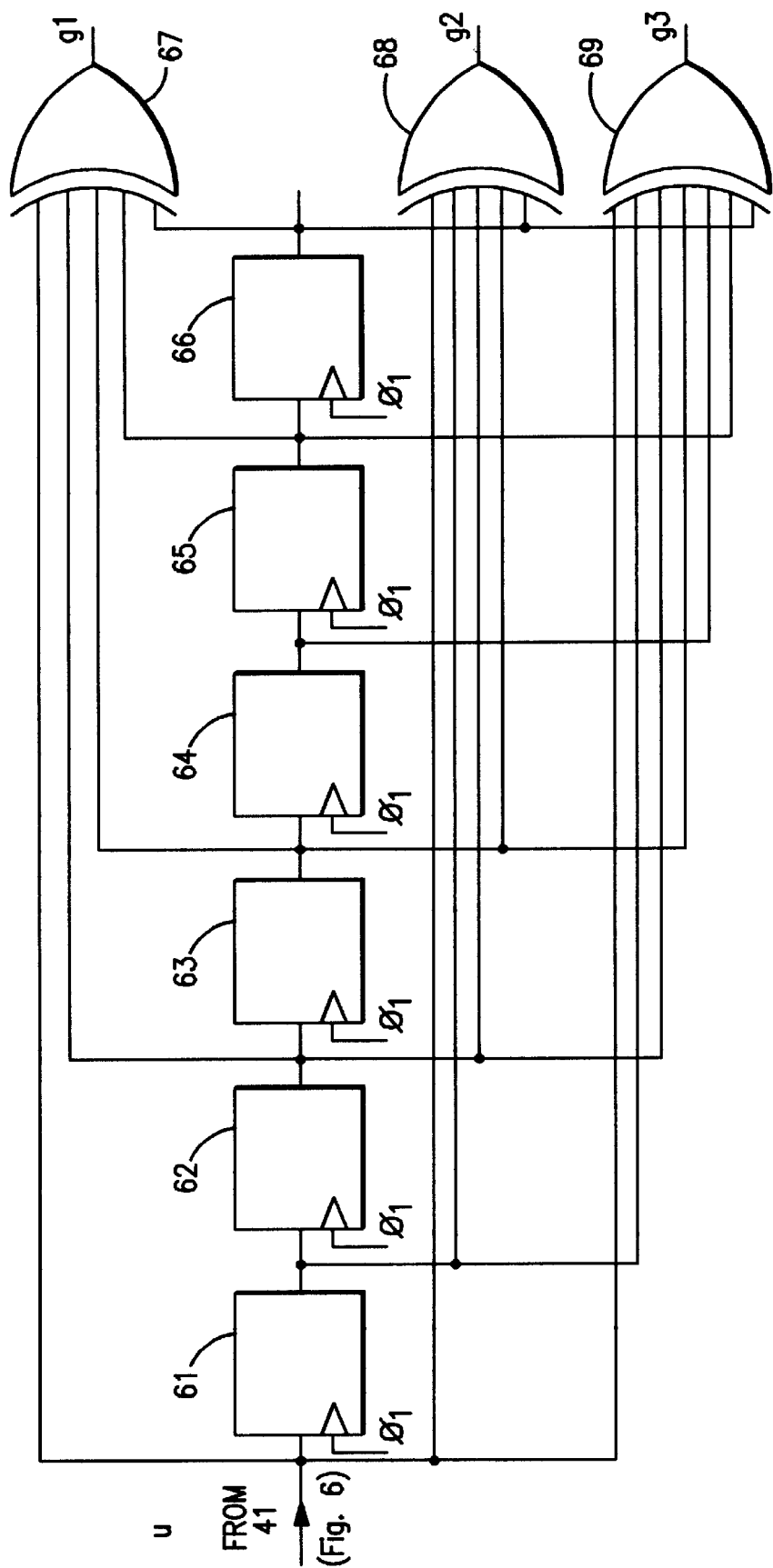

The convolutional coder 6 is shown in FIG. 7 and has six delay stages 61 to 66 and three exclusive-or gates 66, 67, 68 connected to the taps of the delay stages in accordance with the generator polynomials given earlier. The outputs are g1(k), g2(k) and g3(k).

Figure 8:
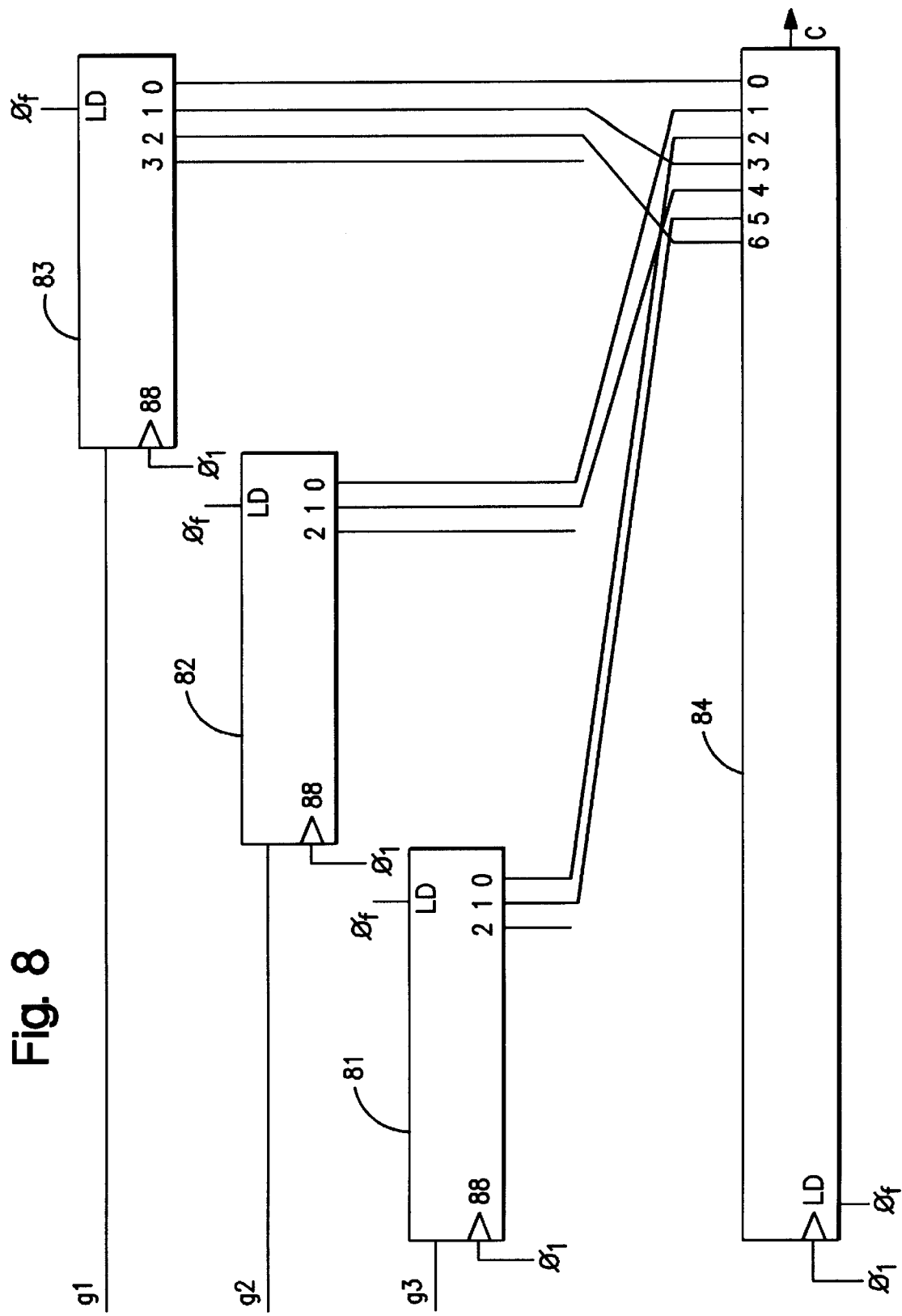

The masking unit is shown in FIG. 8. When the first (rate 1/3) code is used, all bits g1(k), g2(k), g3(k) are forwarded to the output of the unit, cyclically ( g1(0), 92(0), g3(0), g1(1), g2(1) etc.). When the second (punctured) code (rate 2/5) is in force, the masking unit serves to omit alternate ones of the bits g3(k), whilst when the third (rate 1/2) code is use, all bits g3 are omitted. As shown in the Figure, the bits g1, g2, g3 are clocked into serial-in parallel-out shift registers 81, 82, 83 respectively (each of 88 bits capacity) under control of the clock pulses $\phi_1$ and then loaded in parallel into a parallel-in serial-out shift register 84, 228 bits in length by clock pulses $\phi_f$, whence they may again be clocked out serially using $\phi_1$. Only a few of the connections are shown; these are connected in the sequence mentioned, except that the bits g3(k) are, for the following values of k, omitted:

k=30,32,34 . . . 64 (i.e. even numbers from 30 to 62)

k=63 to 69 inclusive k=71, 73, 75, . . . 81 (i.e. odd numbers from 71 to 81)

k=82 to 87 inclusive.

The output bits are referred to as c(k).

The effect of the convolutional code and the following puncturing may be summarised by expressing the coded bits (c(0),c(1), . . . ,c(227)) in terms of u(0), . . . ,u(87), as follows:

CRC bits and class I:

$c(3k)=u(k)+u(k-2)+u(k-3)+u(k-5)+u(k-6)$ $c(3k+1)=u(k)+u(k-1)+u(k-2)+u(k-3)+u(k-6)$ $c(3k+2)=u(k)+u(k-1)+u(k-2)+u(k-3)+u(k-4)+u(k-5)+u(k-6)$ for $k=0,1, \ldots, 28$ Class II:

$$c\left(\frac{5k+1}{2}+13\right) = u(k)+u(k-2)+u(k-3)+u(k-5)+u(k-6)$$

$$c\left(\frac{5k+1}{2}+14\right) = u(k)+u(k-1)+u(k-2)+u(k-3)+u(k-6)$$

$$c\left(\frac{5k+1}{2}+15\right) =$$
$$u(k)+u(k-1)+u(k-2)+u(k-3)+u(k-4)+u(k-5)+u(k-6)$$

for $k = 29, 31, \ldots, 61$ $$c\left(\frac{5k}{2}+14\right) = u(k)+u(k-2)+u(k-3)+u(k-5)+u(k-6)$$

$$c\left(\frac{5k}{2}+15\right) = u(k)+u(k-1)+u(k-2)+u(k-3)+u(k-6)$$

for $k = 30, 32, \ldots, 62$

Class III:

$c(2k+45)=u(k)+u(k-2)+u(k-3)+u(k-5)+u(k-6)$ $c(2k+46)=u(k)+u(k-1)+u(k-2)+u(k-3)-u(k-6)$ for $k=63,64, \ldots, 69$ Class IV:

$$c\left(\frac{5k}{2}+10\right) = u(k)+u(k-2)+u(k-3)+u(k-5)+u(k-6)$$

$$c\left(\frac{5k}{2}+11\right) = u(k)+u(k-1)+u(k-2)+u(k-3)+u(k-6)$$

$$c\left(\frac{5k}{2}+12\right) =$$
$$u(k)+u(k-1)+u(k-2)+u(k-3)+u(k-4)+u(k-5)+u(k-6)$$

for $k = 70, 72, \ldots, 80$ $$c\left(\frac{5k+1}{2}+11\right) = u(k)+u(k-2)+u(k-3)+u(k-5)+u(k-6)$$

$$c\left(\frac{5k+1}{2}+12\right) = u(k)+u(k-1)+u(k-2)+u(k-3)+u(k-6)$$

for $k = 71, 73, \ldots, 81$

Tail:

$c(2k+52)=u(k)+u(k-2)+u(k-3)+u(k-5)+u(k-6)$ $c(2k+53)=u(k)+u(k-1)+u(k-2)+u(k-3)+u(k-6)$ for $k=82,83, \ldots, 87$ The interleaving functions performed by the units 8 and 9 are optional, and if included may be performed by any of a number of known algorithms. A particularly preferred implementation for the present context is however as follows, using modulo arithmetic with a step-size of 59. This value was chosen by trial and error to optimise the burst error performance over a particular radio channel and may be varied to suit particular channel conditions.

Each frame c(k) of the convolutionally coded punctured sequence is mapped to a new frame I(i) using the mapping $m(j)=59j$ mod 228 for $j=0, \ldots, 227$ And $I(j)=c(m(j))$.

For example, bit l(4) of the output frame I from the intra-frame interleaving unit 8 is obtained from bit c(5) of its input;
since $j=4$ $m(j)=m(4)=[59\times 4]$mod 228=233 mod 228=5 so $l(4)=c(m(4))=c(5)$.

Although shown, for clarity, as a separate unit 8, this function can be implemented simply by rearranging the connection to the shift register 84 in FIG. 8.

The inter-frame interleaving performed in the unit 9 may be performed as follows, on the assumption that it is desired to generate 114-bit frames $B_1$ and $B_0$ for transmission. Each such pair of frames contains bits from four of the frames l(j). We refer to the current frame as $l_0$, $l_1$ the last and so on. The mapping between I and B is given by:

$$B_1(k) = I_{3 \cdot k \bmod 4}(k) \text{ for } k=0,1,\ldots,113$$

$$B_0(k) = I_{3 \cdot (k+2) \bmod 4}(k+114) \text{ for } k=0,1,\ldots,113$$

Figure 12:
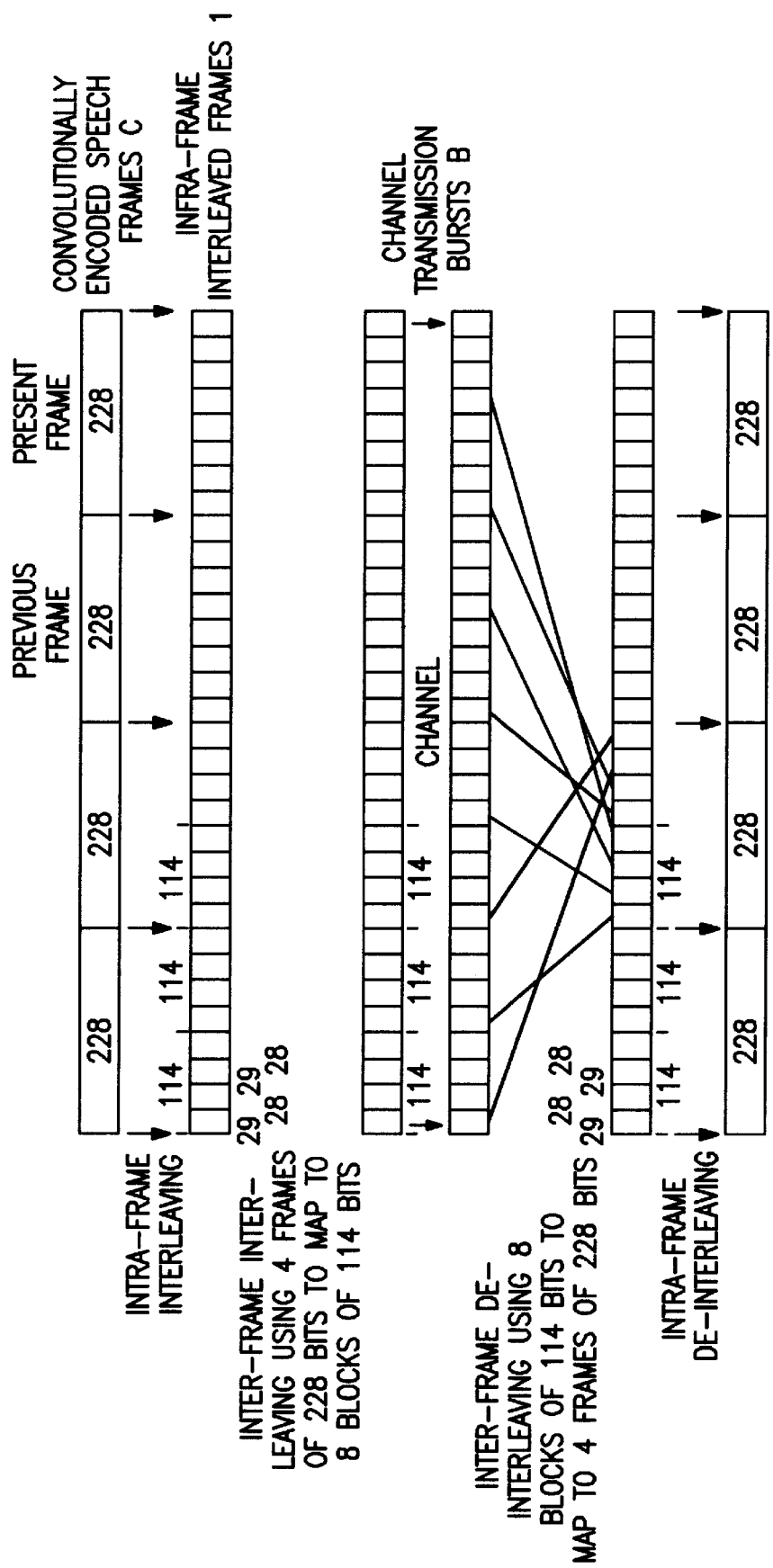
FIG. 12 shows inter-frame interleaving and deinterleaving.

$B_1$ and $B_0$ carry data bits from four speech frames and they are transmitted in that order. FIG. 12 illustrates how the process is carried out.

Note how one 228 bit frame is spread over eight 114-bit blocks, with a fixed pattern of allocating 28 or 29 bits in each block from a single frame.

Figure 9:
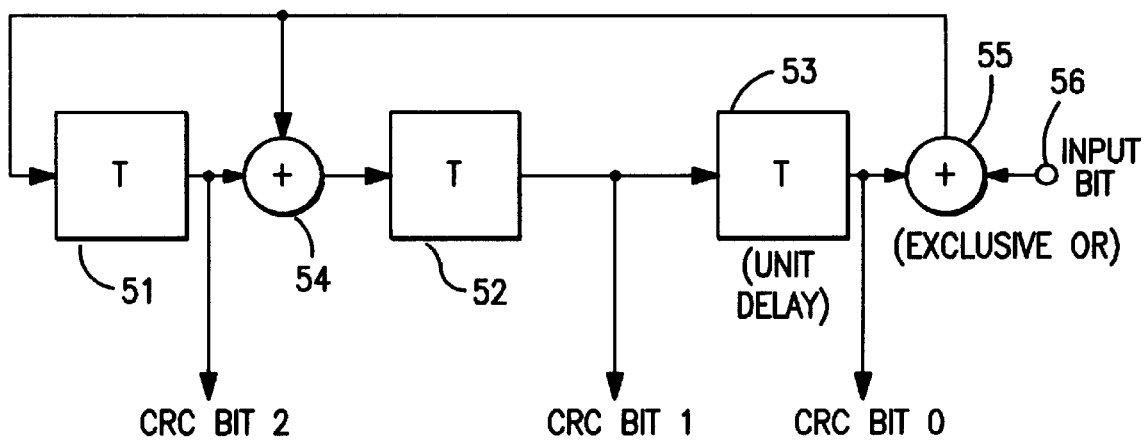

The CRC unit 5, in this example, operates in accordance with the polynomial $1+X+X^3$, which may be implemented by the circuit of FIG. 9, with three one-bit delays 51, 52, 53 and two exclusive-OR gates, 54, 55. The 32 bits from which the CRC bits are to be generated are supplied serially to the input 56. The 32 bits used are the first 26 and the last six speech bits of the frame supplied to the convolutional coder—i.e. u(3) to u(28) and u (76) to u (81). In general, it is found that by choosing bits at the beginning and end of the frame, the effectiveness of a receiver check to identify "bad frames" is enhanced and thus the error rate in the remaining "good frames" is improved. The choice of 26 at the start and six at the end as opposed to, say, 24 and 8, was made by trial and error to minimise the measured good frame error rate during tests.

FIG. 10 shows a suitable receiver for use with the apparatus of FIG. 1. Signals received at an input 110 are assumed to have arrived over a communications path such as a telephone line or radio link and to have been demodulated by a demodulator which provides not only demodulated bits but also a confidence measure for use by a soft decision decoder. For the purposes of the present description, it is assumed that the modulation scheme used transmits one bit per symbol, so that a confidence measure is provided for each bit. However, this may not always be the case; in transmission systems carrying more one bit per symbol, then one obtains a confidence measure (or measures) for each symbol. These data are then supplied to a channel equaliser 111, followed by an inter-frame interleavers 112, both being of conventional construction. This is followed by a soft decision transformation unit 113, whose function will be discussed below, and an intra-frame interleaver 114. Units 112 and 114 remove the effects of the interleavers 8 and 9 of FIG. 1. The signal then passes to a "demasker" 115 which reinserts into the bit stream the "g3" bits which were deleted in the masker 7. Of course, the values of these bits is not known, and (as is usual for decoding of punctured codes) one may insert bit values of zero with an accompanying confidence measure of zero. Sometimes inserting zeros (or ones) may result in decoder bias and if desired, random bit values may be inserted.

The signal has now been formatted in accordance with the first (1/3 rate) convolutional code and is now supplied to a Viterbi decoder 115 (of conventional construction) which operated according to that code. A CRC unit 117 performs a cyclic redundancy check, and the decoder bits are assembled (118) for use by a speech decoder 120 (G.729) with the Gray-coded bits being receded at 119.

The output of the cyclic redundancy check is supplied to the speech decoder 12 so that in the event of failure the relevant decoded frame is discarded, the speech decoder regenerating the discarded information using the error concealment method described in the G.729 standard. It is observed, however, that there is a limit to the number of errors such methods can detect, so that, when channel conditions are extremely bad, the number of errors may be such that a "bad frame" indication is not obtained. Thus, additionally, a further error detector 122 is provided, which serves to sum the confidence measures for each bit of a frame to form a "frame score" b—viz.

$$b = \sum_{k=0}^{227} e(k)$$

where e(k) are confidence measures in the range 0 to +127. This frame score could equally well be calculated after the soft decision transformation process, described below, in which case the error detector 122 would receive its input from the soft decision transformer 113.

A threshold is applied at 123 and if b exceeds 2100 (for example) a bad frame indication is output which is combined in an OR gate 124 with the output from the CRC check unit 117 so that rejection also occurs for all frames with b>2100. If, of course a different range of values is used for e(k) then a different threshold value will be appropriate.

We return now to the soft decision transformation unit 113. The soft decision inputs for the Viteroi decoder are produced by the channel equaliser 111. Ideally these inputs should be logarithmically inversely proportion to the likelihood of a bit error having occurred, or, in other words, directly proportional to $$\log \frac{1-P_e}{P_e}$$

where $P_e$ is the probability of an error in the bit in question. Tests show however that this is not always the case. The method for testing a channel is as follows:

(a) transmit test data
(b) record the received data and associate confidence measures e(k)
(c) compare the received data with the original to determine which bits are in error
(d) for each value of e(k) (from 0 to 127), count the number of bits N received with that measure and the number of bits n actually in error; compute $P_e = n/N$ and hence $$\varepsilon = \log \frac{1-P_e}{P_e}.$$

Figure 11:
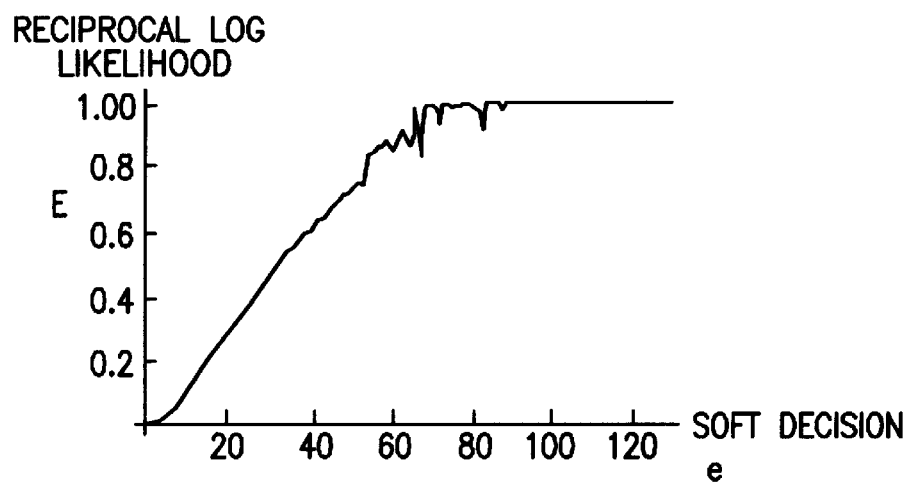
FIG. 11 shows a typical plot of the likelihood of a bit error against the confidence measure for that bit.

FIG. 11 shows a typical plot of $\varepsilon$ against e. As is seen, this deviates significantly from a straight line. The Viterbi algorithm produces the best results when true log likelihoods of error are used. This is because it operated by adding these values to obtain accumulated distance metrics, which is not equivalent to taking the products of the error probabilities (which is what is really required) unless a logarithmic relationship is adhered to.

Thus the purpose of the transformation unit 113 is to provide a correction for this nonlinear characteristic. It is implemented as a look-up table having 128 locations accessed using e as the address. The contents of the lookup table are the values of e in FIG. 11 i.e.
for e=0 to 127:

$\varepsilon(e) = \{$0, 1, 2, 3, 5, 7, 9, 11, 13, 15,
18, 20, 23, 25, 27, 30, 32, 35, 37, 39,
42, 44, 47, 48, 51, 52, 55, 57, 59, 61,
63, 65, 67, 69, 70, 72, 74, 77, 77, 79,
82, 81, 85, 86, 89, 87, 92, 91, 95, 95,
96, 94, 95, 107, 107, 112, 109, 115, 108, 106,
114, 119, 114, 107, 127, 110, 105, 126, 126, 126,
117, 127, 127, 127, 125, 127, 125, 127, 127, 127,
124, 115, 127, 127, 127, 127, 123, 127, 127, 127,
127, 127, 127, 127, 127, 127, 127, 127, 127, 127,
127, 127, 127, 127, 127, 127, 127, 127, 127, 127,
127, 127, 127, 127, 127, 127, 127, 127, 127, 127,
127, 127, 127, 127, 127, 127, 127, 127$\}$ It should be noted that this mapping needs to suit the channel equaliser in use: in general each equaliser will have its own characteristics and therefore the contents of the look-up table need to be based on tests performed—as described above—on that particular design. If desired, the system may be made adaptive with transmissions including a known test sequence which may be analysed at intervals using the above-described method and the results used to update the contents of the look-up table.

What is claimed is:

1. A method of decoding signals by processing received signals to provide confidence measure signal values and using a soft decision decoder to decode the received signals, the method comprising:
   (a) receiving known signals;
   (b) storing data representing the extent to which the confidence measure signal value statistics for the received known signals differ from a logarithmic representation of the error statistics of the received known signals;
   (c) receiving unknown signals;
   (d) applying correction factors to the confidence measure signal values for the received unknown signals, the correction factors being derived from the said stored data, so as to reduce the extent to which the confidence measure signal value statistics for the received unknown signals differ from the said logarithmic representation; and
   (e) decoding the corrected signals using the soft decision decoder.

2. A method according to claim 1 including:
forming a sum of the confidence measure signal values for a frame period of the received unknown signals; and
comparing the sum with a threshold value to provide a signal indicating the quality of the frame.

3. A method according claim 2 including, in response to the said signal indicating the quality of the frame, suppressing further processing of those frames which are of a lower quality than that determined by the said threshold.

4. A method of decoding signals comprising:
processing received digital signals to provide confidence measure signal values;
forming a sum of the confidence measure signal values for a frame period of the received digital signals; and
comparing the sum with a threshold value to provide a signal indicating the quality of the frame.

5. A method according to claim 4 including, in response to the said signal indicating the quality of the frame, suppressing further processing of those frames which are of a lower quality than that determined by the said threshold.

6. An apparatus for decoding signals comprising:
means for processing received digital signals to provide confidence measure signal values;
translation means operable to apply correction factors to the confidence measure signal values so as to reduce the extent to which the confidence measure signal value statistics differ from a logarithmic representation of the error statistics of the received signals; and
a soft decision decoder to decode the corrected signals.

7. An apparatus according to claim 6 in which the correction factors are derived from tests performed by:
   (a) receiving known signals;
   (b) storing data representing the extent to which the confidence measure signal value statistics for the received known signals differ from a logarithmic representation of the error statistics of the received known signals.

8. An apparatus according to claim 6 including:
means to form a sum of the confidence measure signal values for a frame period of the received digital signals; and
means to compare the sum with a threshold value to provide a signal indicating the quality of the frame.

9. An apparatus according to claim 8 including means operable in response to the said signal indicating the quality of the frame to suppress further processing of those frames which are of a lower quality than that determined by the said threshold.

10. An apparatus for decoding signals comprising:
means for processing received digital signals to provide confidence measure signal values;
means for forming a sum of the confidence measure signal values for a frame period of the received digital signals; and
means for comparing the sum with a threshold value to provide a signal indicating the quality of the frame.

11. An apparatus according to claim 10 including means operable in response to the said signal indicating the quality of the frame to suppress further processing of those frames which are of a lower quality than that determined by the said threshold.

* * * * *